US012720724B2

(12) United States Patent
Tung et al.

(10) Patent No.: US 12,720,724 B2
(45) Date of Patent: Aug. 25, 2026

(54) SEMICONDUCTOR DEVICE AND FABRICATING METHOD THEREOF

(71) Applicant: Fujian Jinhua Integrated Circuit Co., Ltd., Quanzhou City (CN)

(72) Inventors: Yu-Cheng Tung, Quanzhou City (CN); Janbo Zhang, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 317 days.

(21) Appl. No.: 18/211,602

(22) Filed: Jun. 20, 2023

(65) Prior Publication Data

US 2024/0237329 A1 Jul. 11, 2024

(30) Foreign Application Priority Data

Jan. 10, 2023 (CN) ......................... 202310037013.5
Jan. 10, 2023 (CN) ......................... 202320079059.9

(51) Int. Cl.
*H10B 12/00* (2023.01)

(52) U.S. Cl.
CPC ....... *H10B 12/0335* (2023.02); *H10B 12/315* (2023.02)

(58) Field of Classification Search
CPC ... H10D 1/716; H10B 12/0335; H10B 12/315
See application file for complete search history.

(56) References Cited

U.S. PATENT DOCUMENTS 7,067,385 B2 6/2006 Manning
9,559,103 B2 1/2017 Park
10,170,541 B2 1/2019 Yi et al.
10,373,957 B2 8/2019 Chang
10,998,318 B2 5/2021 Choo et al.
11,056,355 B2 7/2021 Choi et al.
11,557,645 B2 1/2023 Tsai et al.
11,930,631 B2 3/2024 Chen
2003/0122174 A1* 7/2003 Fukuzumi .............. H10D 1/042 438/665
2012/0264271 A1 10/2012 Kuh
2017/0345886 A1* 11/2017 Yi .......................... H10D 1/716

(Continued)

FOREIGN PATENT DOCUMENTS

CN 111463206 7/2020
CN 113130495 7/2021
GB 2400236 10/2004

*Primary Examiner* — Steven M Page
(74) *Attorney, Agent, or Firm* — Winston Hsu

(57) ABSTRACT

The present disclosure provides a semiconductor device and a fabricating method thereof, and the semiconductor device includes a substrate, a capacitor structure, a supporting structure and a supplementary layer. The capacitor structure is disposed on the substrate, and includes a plurality of columnar bottom electrodes, a capacitor dielectric layer, and a top electrode layer. The supporting structure is disposed between adjacent ones of the columnar bottom electrodes, and the supporting structure includes a first supporting layer and a second supporting layer stacked from bottom to top. The supplementary layer is disposed between each of the columnar bottom electrodes and the supporting structure, to directly in contact with the first supporting layer, the second supporting layer, and sidewalls of the columnar bottom electrodes.

20 Claims, 9 Drawing Sheets

(56) References Cited

U.S. PATENT DOCUMENTS

| | | | | |
|---|---|---|---|---|
| 2021/0066066 | A1 | 3/2021 | Lee et al. | |
| 2021/0151439 | A1 * | 5/2021 | Choi | H01L 21/7682 |
| 2021/0202490 | A1 * | 7/2021 | Cho | H10D 1/716 |
| 2022/0037461 | A1 * | 2/2022 | Cho | H10B 12/34 |
| 2022/0085149 | A1 | 3/2022 | Zhu | |
| 2022/0336578 | A1 * | 10/2022 | Cho | H10B 12/315 |
| 2023/0120682 | A1 | 4/2023 | Kim et al. | |
| 2023/0253445 | A1 * | 8/2023 | Chae | H10B 12/033 257/213 |

* cited by examiner

SEMICONDUCTOR DEVICE AND FABRICATING METHOD THEREOF

BACKGROUND OF THE INVENTION

1. Field of the Invention

The present disclosure relates to a semiconductor device and a fabricating method thereof, and more particularly, to a semiconductor memory device and a fabricating method thereof.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM only having planar gate structures under the current mainstream development trend. Generally, the DRAM having recessed gate structures is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to satisfy the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

In order to achieve the above object, an embodiment of the present disclosure provides a fabricating method of a semiconductor device, in which a sacrificial layer is previously formed on sidewalls of the through holes before forming columnar bottom electrodes, to protect the sidewalls of the through holes, and the sacrificial layer is partially removed in the subsequent process, to form a supplementary layer only between the columnar bottom electrodes and the supporting structure. According to the formation of the supplementary layer, the adhesion and the stress buffering between the metal (namely the columnar bottom electrode) and the dielectric material (namely the supporting structure) are both improved, and also, the spaces between the columnar bottom electrodes are further expanded to enlarge the deposition space of the capacitor dielectric layer and the top electrode layer formed subsequently. Then, the deposition of the capacitor dielectric layer and the top electrode layer will be carried out more smoothly, to simplify the fabricating processes thereof.

In order to achieve the above object, an embodiment of the present disclosure provides a semiconductor device, where a supplementary layer is disposed only between the columnar bottom electrodes and the supporting structure, to strengthen the adhesion between the metal (namely the columnar bottom electrodes) and the dielectric material (namely the supporting structure), and also, to provide the stress buffering therebetween. The supplementary layer and the supporting structure together support the columnar bottom electrodes. Then, the semiconductor device may therefore obtain a more reliable and stable structure, to achieve better functions and performance.

To achieve the above object, one embodiment of the present disclosure provides a semiconductor device includes a substrate, a capacitor structure, a supporting structure and a supplementary layer. The capacitor structure is disposed on the substrate, and includes a plurality of columnar bottom electrodes, a capacitor dielectric layer, and a top electrode layer. The supporting structure is disposed between adjacent ones of the columnar bottom electrodes, and the supporting structure includes a first supporting layer and a second supporting layer stacked from bottom to top. The supplementary layer is only sandwiched between each of the columnar bottom electrodes and the supporting structure, to directly in contact with the first supporting layer, the second supporting layer, and sidewalls of the columnar bottom electrodes.

To achieve the above object, one embodiment of the present disclosure provides a fabricating method of a semiconductor device including the following steps. Firstly, a substrate is provided, and a capacitor structure is formed on the substrate, wherein the capacitor structure is formed on a plurality of columnar bottom electrodes, a capacitor dielectric layer, and a top electrode layer. Then, a supporting structure is formed between adjacent ones of the columnar bottom electrodes, and the supporting structure includes a first supporting layer and a second supporting layer stacked from bottom to top. The supplementary layer is only formed between each of the columnar bottom electrodes and the supporting structure, to directly in contact with the first supporting layer, the second supporting layer, and sidewalls of the columnar bottom electrodes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 to FIG. 7 are schematic diagrams illustrating a fabricating method of a semiconductor device according to a first embodiment in the present disclosure, wherein:

FIG. 1 shows a schematic cross-sectional view of a semiconductor device of the present disclosure after forming storage node pads;

FIG. 2 shows a schematic cross-sectional view of a semiconductor device of the present disclosure after forming a supporting layer structure;

FIG. 3 shows a schematic cross-sectional view of a semiconductor device of the present disclosure after forming a bottom electrode layer;

FIG. 4 shows a schematic cross-sectional view of a semiconductor device of the present disclosure after forming mask patterns;

FIG. 5 shows a schematic cross-sectional view of a semiconductor device of the present disclosure after removing a first supporting material layer;

FIG. 6 shows a schematic cross-sectional view of a semiconductor device of the present disclosure after removing a sacrificial layer; and FIG. 7 shows a schematic cross-sectional view of a semiconductor device of the present disclosure after forming a capacitor structure.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
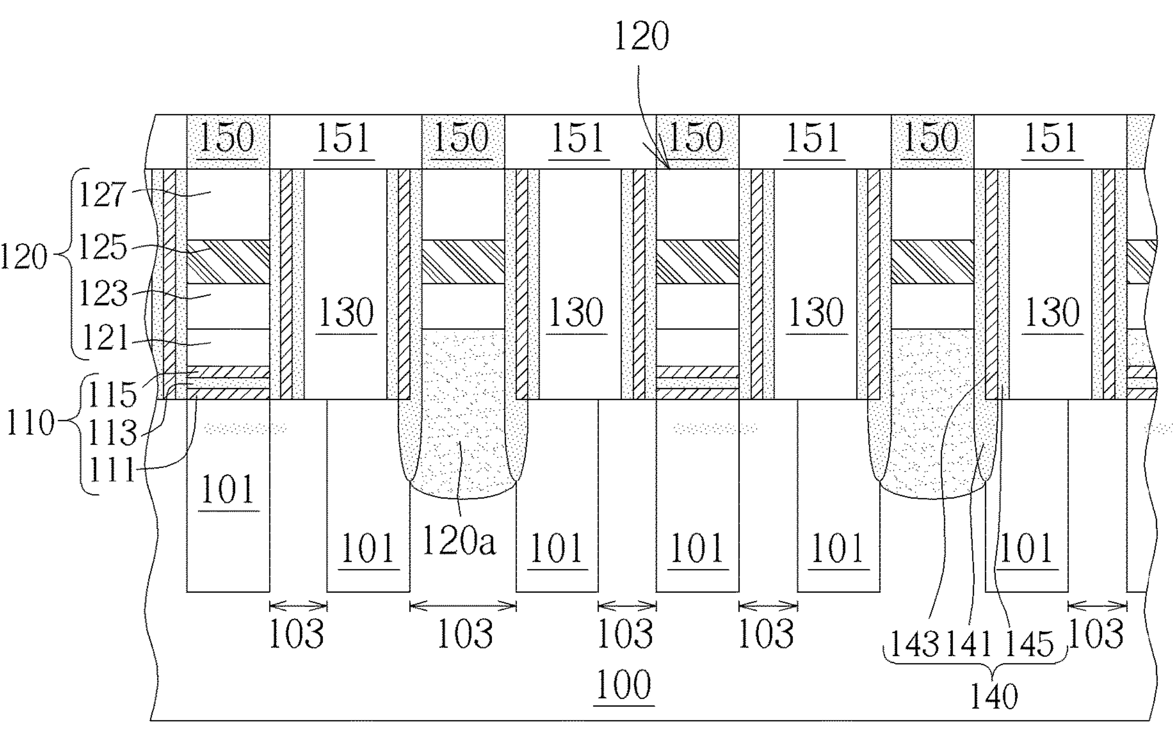

Referring to FIG. 1 to FIG. 7 which illustrate a fabricating method of a semiconductor device 300 in one embodiment of the present disclosure. Firstly, as shown in FIG. 1, a substrate 100 is provided, such as a silicon substrate, a silicon-containing substrate (like a SiC substrate or a SiGe substrate, etc.) or a silicon-on-insulator (SOI) substrate, and at least one insulating region such as a shallow trench isolation (STI) 101 is formed in the substrate 100, to define a plurality of active areas (AAs) 103 within the substrate 100. Accordingly, all of the active areas 103 are surrounded by the shallow trench isolation 101 as being viewed from a top view diagram (not shown in the drawings). In one embodiment, the formation of the shallow trench isolation 101 is accomplished by first forming a plurality of trenches (not shown in the drawings) in the substrate 100 through an etching process, and then filling the trenches with an insulating material (such as silicon oxide or silicon oxynitride), to form the shallow trench isolation 101 having a coplanar surface with the top surface of the substrate 100, but not limited thereto.

Next, a dielectric layer 110 is formed on the substrate 100, the dielectric layer 110 preferably includes a multilayer structure for example including an oxide-nitride-oxide (ONO) structure having an oxide layer 111-*a* nitride layer 113-*an* oxide layer 115, but not limited thereto. It is noted that, before forming the dielectric layer 110, a plurality of buried gates (not shown in the drawings) is formed in the substrate 100, and the dielectric layer 110 is then formed to cover on the top surfaces of the buried gates. The buried gates are extended parallel to each other in one direction (e.g., the X direction, not shown in the drawings), to serve as the buried word lines (BWL, not shown in the drawings) of the semiconductor device 300. On the other hand, a plurality of bit lines 120 and a plurality of plugs 130 are formed on the substrate 100, where the bit lines 120 are parallel extended along another direction (e.g., the Y direction, not shown in the drawings) being perpendicular to the said direction. Although the overall extending directions of the active areas 103, the buried gates and the bit lines 120 are not specifically depicted in the drawings of the present embodiment, it should be easily understood by those skilled in the art that the bit line 120 should be perpendicular to the buried gate and intersected with the active areas 103 and the buried gates at the same time as being viewed from a top view diagram (not shown in the drawings).

Precisely speaking, each of the bit lines 120 and each of the plugs 130 are alternately arranged along a specific direction, and each of the bit lines 120 includes a semiconductor layer (for example including polysilicon) 121, a barrier layer (for example including titanium and/or titanium nitride) 123, a conductive layer (for example including a low-resistance metal like tungsten, aluminum or copper) 125, and a capping layer (for example including silicon oxide, silicon nitride or silicon oxynitride) 127 stacked from bottom to top, but not limited thereto. Generally, all of the bit lines 120 are separately disposed on the dielectric layer 110, to intersect with the active areas 103, where the bit lines 120 across each active area 103 are further extended into each active area 103 via a bit line contact (BLC) 120*a* correspondingly formed below the bit lines 120, as shown in FIG. 1. In other words, the bit line contacts 120*a* and the semiconductor layer 121 of the bit lines 120 are monolithic in the present embodiment, to directly in contact with the corresponding active areas 103, but not limited thereto.

The plugs 130 are also separately disposed on the substrate 100, to directly contact the substrate 100 (including the active areas 103 and the shallow trench isolation 101) underneath, to serve to the storage node contacts (SNCs) of the semiconductor device 300, thereby receiving or transmitting the voltage signals from each memory cell unit. In one embodiment, the plugs 130 for example include a low-resistance metal material, such as aluminum (Al), titanium (Ti), copper (Cu) or tungsten (W), and each of the plugs 130 and the bit lines 120 are insulated from each other by a spacer structure 140 therebetween. In one embodiment, the spacer structure 140 optionally includes a monolayer structure or a multilayer structure as shown in FIG. 1, for example includes but not limited to a first spacer 141 (for example including silicon nitride), a second spacer 143 (for example including silicon oxide) and a third spacer 145 (for example including silicon nitride) stacked in sequence on the sidewalls of each bit line 120.

Please also refer to FIG. 1, a dielectric layer 150 and a plurality of storage node pads (SN pads) 151 are further formed on the bit lines 120 and the plugs 130, with the dielectric layer 150 entirely covering the bit lines 120 and the plugs 130, and with the storage node pads 151 being separately disposed within the dielectric layer 150. Each of the storage node pads 151 includes a coplanar surface with the top surface of the dielectric layer 150, to respectively contact to each of the plugs 130 underneath, and to electrically connect thereto. In one embodiment, the storage node pads 151 also includes a low-resistance metal material like aluminum, titanium, copper or tungsten, such as a metal material different from that of the plugs 130, and the dielectric layer 150 for example includes a dielectric material like silicon nitride, but is not limited thereto. In another embodiment, the storage node pads may be integrally formed with the plugs 130 to therefore include the same material.

Figure 2:
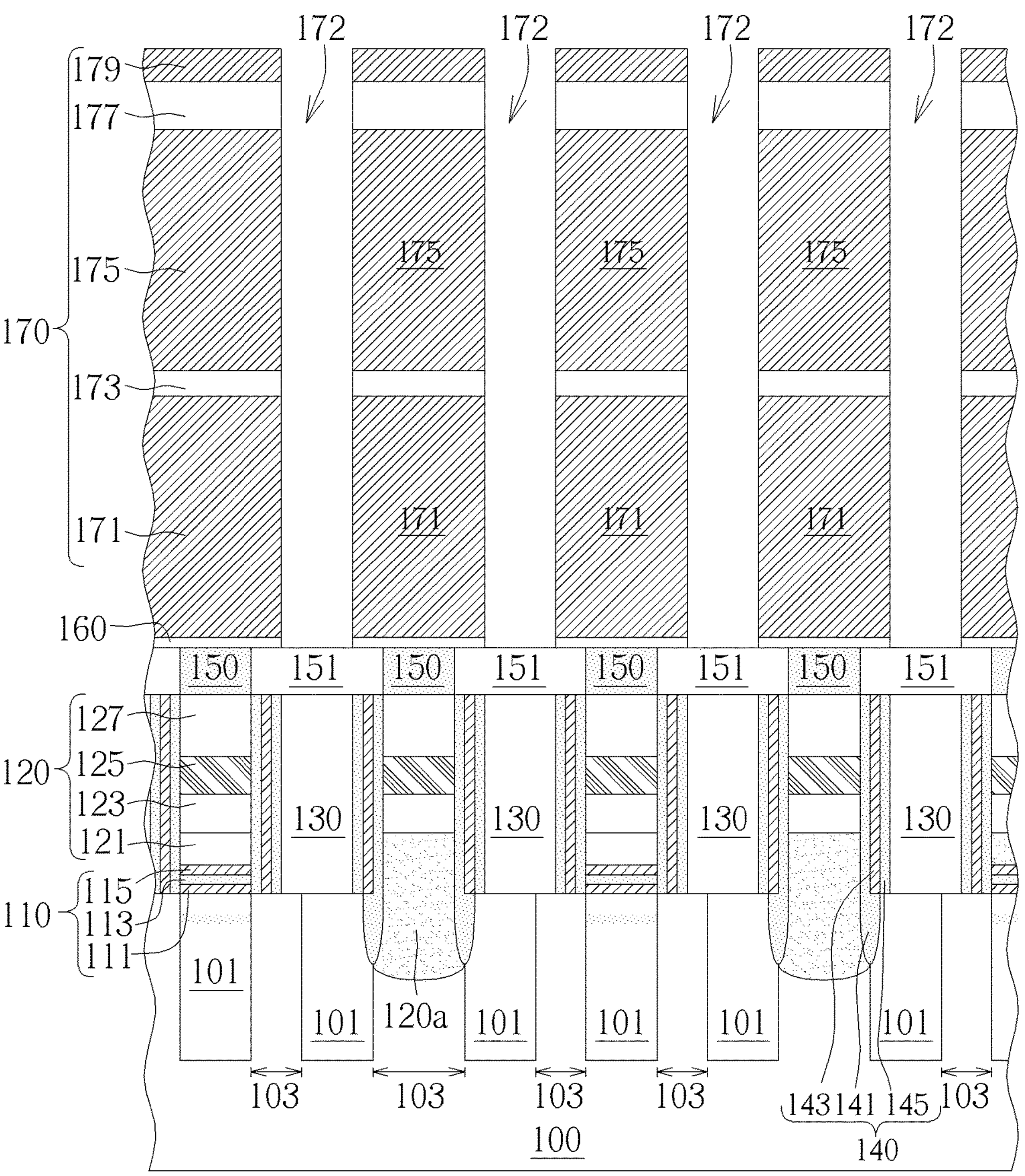

As shown in FIG. 2, an insulating layer 160 and a supporting layer structure 170 are sequentially formed on the dielectric layer 150, wherein the insulating layer 160 for example includes an insulating material like silicon oxide or silicon oxynitride, and the supporting layer structure 170 includes at least one oxide layer and at least one nitride layer stacked alternately. In the present embodiment, the supporting layer structure 170 includes for example a first supporting material layer 171 (for example including silicon oxide), a second supporting material layer 173 (for example including silicon nitride or silicon carbonitride), a third supporting material layer 175 (for example including silicon oxide), a fourth supporting material layer 177 (for example including silicon nitride or silicon carbonitride) and a fifth supporting material layer 179 (for example including silicon oxide) stacked in order from bottom to top, but not limited thereto. Then, a plurality through holes 172 is formed in the supporting layer structure 170 to sequentially penetrate through the fifth supporting material layer 179, the fourth supporting material layer 177, the third supporting material layer 175, the second supporting material layer 173, the first supporting material layer 171 and the insulating layer 160, to align with each of the storage node pads 151 underneath respectively, so that, the top surface of each of the storage node pads 151 is therefore exposed from the through holes 172 respectively.

Preferably, the oxide layer (for example the first supporting material layer 171 or the third supporting material layer 175) has a relatively larger thickness, for example being about 5 times to more than 10 times of the thickness of the nitride layer (for example the second supporting material layer 173 or the fourth supporting material layer 177), and the thickness of the nitride layer (for example the fourth supporting material layer 177) located away from the substrate 100 is preferably greater than the thickness of the nitride layer (for example the second supporting material layer 173) located close to the substrate 100, as shown in FIG. 2, but not limited thereto. In the present embodiment, the overall thickness of the supporting layer structure 170 will reach about 1600 Å (angstroms) to about 2000 Å, but not limited thereto. It should be understood by those skilled in the art that the specific stacking numbers of the aforementioned oxide layers (such as the first supporting material layer 171, the third supporting material layer 175, or the fifth supporting material layer 179) and the aforementioned nitride layers (such as the second supporting material layer 173 or the fourth supporting material layer 177) are not limited to the aforementioned numbers, and which may be further adjusted according to the actual requirements, for example being four layers, five layers or other numbers of layers.

Figure 3:
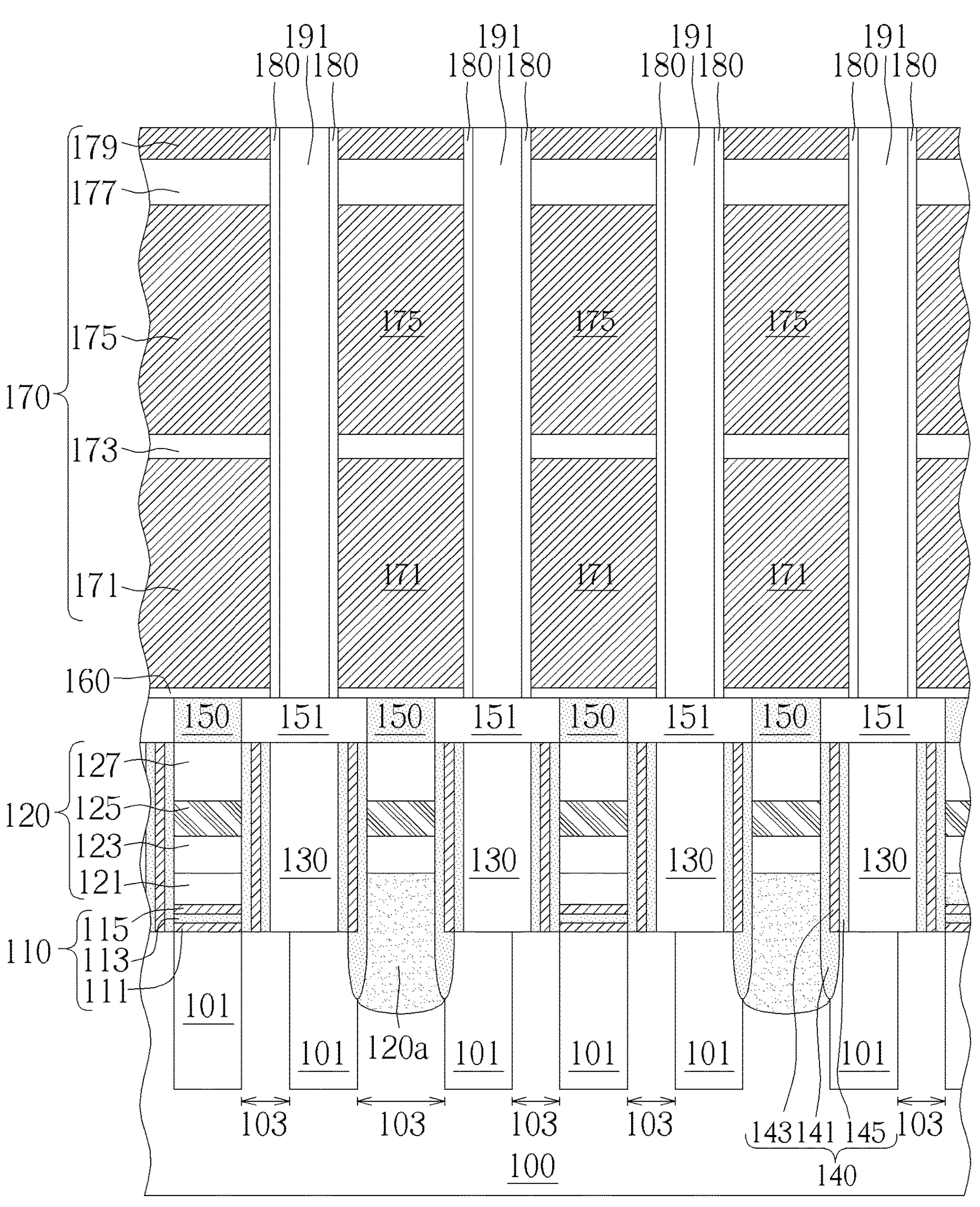

Next, as shown in FIG. 3, a sacrificial layer 180 and a bottom electrode layer 191 are formed in each of the through holes 172. Precisely speaking, the sacrificial layer 180 for example includes a general dielectric material like silicon oxide, silicon nitride or silicon oxynitride, to cover on sidewalls of each through hole 172. The bottom electrode layers 191 fill in the through holes 172 respectively. In the present embodiment, the formation of the sacrificial layer 180 and the bottom electrode layers 191 include but not limited to the following steps. Firstly, a deposition process is performed to form a sacrificial material layer (not shown in the drawings) on the substrate 100, to cover the exposed surfaces of the supporting layer structure 170 and the through holes 172, and an etching back process is then performed to partially remove the sacrificial material layer, to form the sacrificial layer 180 only disposed on sidewalls of each through hole 172. Then, another deposition process and another etching back process are performed to form the bottom electrode layer 191 filled in each through hole 172, with each of the bottom electrode layers 191 having a left-right symmetric columnar structure. The top surface of the bottom electrode layers 191 is coplanar with the top surface of the fifth supporting material layer 179, as shown in FIG. 3. In one embodiment, the bottom electrode layers 191 for example includes a low-resistance metal material, such as aluminum, titanium, copper or tungsten, and preferably include titanium, but is not limited thereto.

Figure 4:
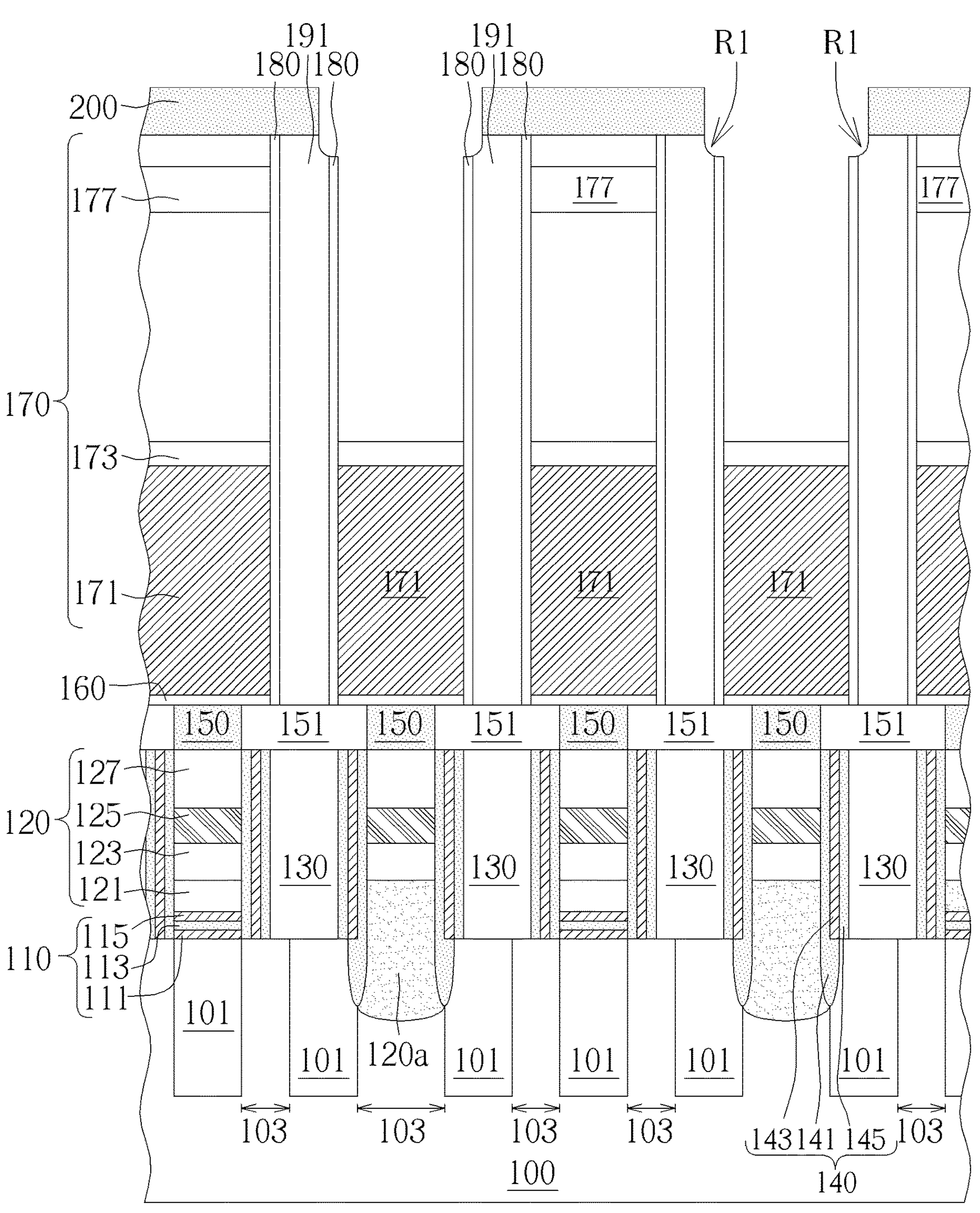

Next, as shown in FIG. 4, a plurality of mask patterns 200 is formed on the substrate 100, to cover a portion of the fifth supporting material layer 179 and a portion of the bottom electrode layers 191. Precisely speaking, each of the mask patterns 200 covers the top surface of the supporting layer structure 170 through a manner by simultaneously covering about one-third of the top surfaces of two adjacent ones of the bottom electrode layers 191 and the top surface of the fifth supporting material layer 179 between the two adjacent ones of the bottom electrode layers 191. Then, a first etching process such as a dry etching process and a second etching process such as an isotropic wet etching process are sequentially performed through the mask patterns 200, to completely remove the fifth supporting material layer 179 and the third supporting material layer 175 of the supporting layer structure 170, and to remove a portion of the fourth supporting material layer 177 which is not covered by the mask patterns 200. After that, partial sidewalls of the sacrificial layer 180 are exposed. It is noted that, in one embodiment, the bottom electrode layers 191 and the sacrificial layers 180 being uncovered from the mask patterns 220 are also etched during the first etching process, so that, a recess R1 is formed on the top of each bottom electrode layer 191 and the sacrificial layer 180. The recessed opening of the recess R1 is away from the fourth supporting material layer 177, and the bottommost surface of the recess R1 is higher than the top surface of the fourth supporting material layer 177 and is lower than the top surface of the bottom electrode layers 191, as shown in FIG. 4.

Figure 5:
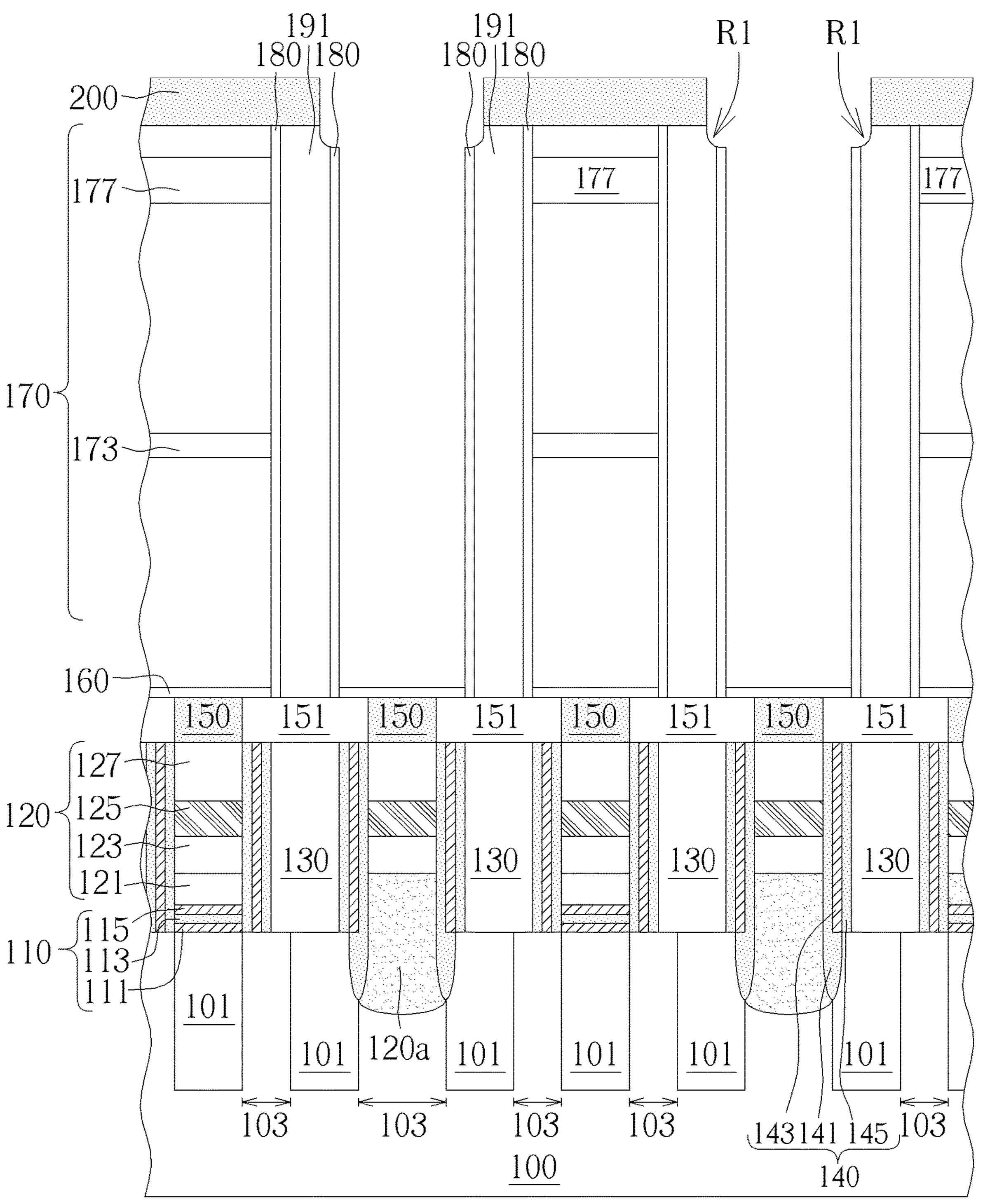

As shown in FIG. 5, a third etching process such as a dry etching process, and a fourth etching process such as an isotropic wet etching process are sequentially performed through the mask patterns 200, to completely remove the first supporting material layer 171 of the supporting layer structure 170, and to remove a portion of the second supporting material layer 173 which is not covered by the mask patterns 200. After that, sidewalls of the sacrificial layer 180 are further exposed. In one embodiment, the fourth etching process and the second etching process are carried out by introducing an etchant like tetramethylammonium hydroxide (THAM), but not limited thereto. It is also noted that, since the sacrificial layers 180 is disposed on the sidewalls of each bottom electrode layer 191 for protecting thereto, the sacrificial layer 180 enables to prevent the sidewalls of each bottom electrode layer 191 from being etched during the first etching process and the second etching process.

Figure 6:
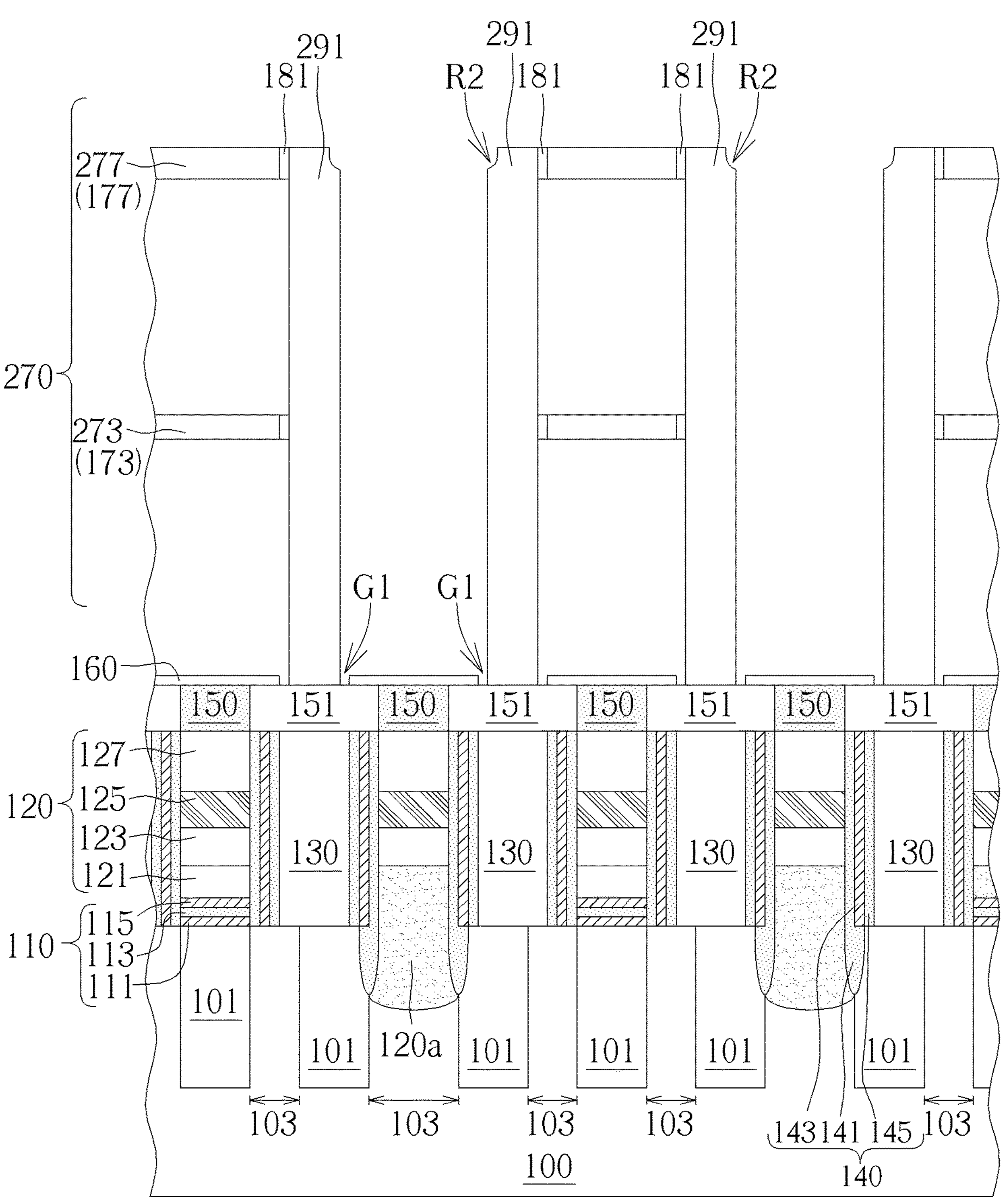

As shown in FIG. 6, after completely removing the mask patterns 200, a fifth etching process such as an isotropic wet etching process is performed, by also introducing an etchant like tetramethylammonium hydroxide, to remove the sacrificial layers 180. While performing the fifth etching process, the top of the fourth supporting material layer 177 is etched to reduce the overall thickness of the fourth supporting material layer 177. Then, the remained portion of the fourth supporting material layer 177 and the remained portion of the second supporting material layer 173 respectively form a second supporting layer 277 and a first supporting layer 273 stacked from top to bottom, wherein the second supporting layer 277 and the first supporting layer 273 preferably include the same thickness, but not limited thereto.

Meanwhile, while performing the fifth etching process, the tops of the bottom electrode layers 191 are also removed, to reduce the height of each of the bottom electrode layers 191, thereby forming a plurality of columnar bottom electrodes 291. Accordingly, the sacrificial layers 180 sandwiched between each columnar bottom electrode 291 and the second supporting layer 277, and sandwiched between each columnar bottom electrode 291 and the first supporting layer 273, will not be removed because of being affected by the stress both from the metal (namely, the columnar bottom electrodes 291) and from the dielectric material (namely, the second supporting layer 277 and the first supporting layer 273) at the same time. Then, a plurality of supplementary layers 181 is formed only between each columnar bottom electrode 291 and the first supporting layer 273, and between each columnar bottom electrode 291 and the second supporting layer 277, as shown in FIG. 6.

Further in view of FIG. 6, the first supporting layer 273 and the second supporting layer 277 are disposed only at one side of each columnar bottom electrode 291, with the supplementary layers 181 enhancing the adhesion and the stress buffering between the metal (namely, the columnar bottom electrodes 291) and the dielectric material (namely, the second supporting layer 277 and the first supporting layer 273), and the first supporting layer 273 and the second supporting layer 277 together form a supporting structure 270 for supporting the columnar bottom electrodes 291. The top of each of the columnar bottom electrodes 291 is coplanar with the top surface of the second supporting layer 277, and includes a recess R2 with the recessed opening thereof being away from the supporting structure 270, wherein a bottommost surface of the recess R2 is higher than the bottom surface of the second supporting layer 277. The recesses R2 on two adjacent ones of the columnar bottom electrodes 291 are arranged in a face-to-face manner, or in a back-to-back manner. Also, since the sacrificial layer 180 originally formed between each columnar bottom electrode 291 and the insulating layer 160 has been removed during the fifth etching process, there is a gap G1 formed between the bottom of each columnar bottom electrode 291 and the insulating layer 160 to separate therefrom instead of being directly in contact with each other. Thus, two adjacent ones of the columnar bottom electrodes 291 are in mirror-symmetric to each other, to be beneficial on enlarging the deposition space for the subsequent forming capacitor dielectric layer and the top electrode layer.

Figure 7:
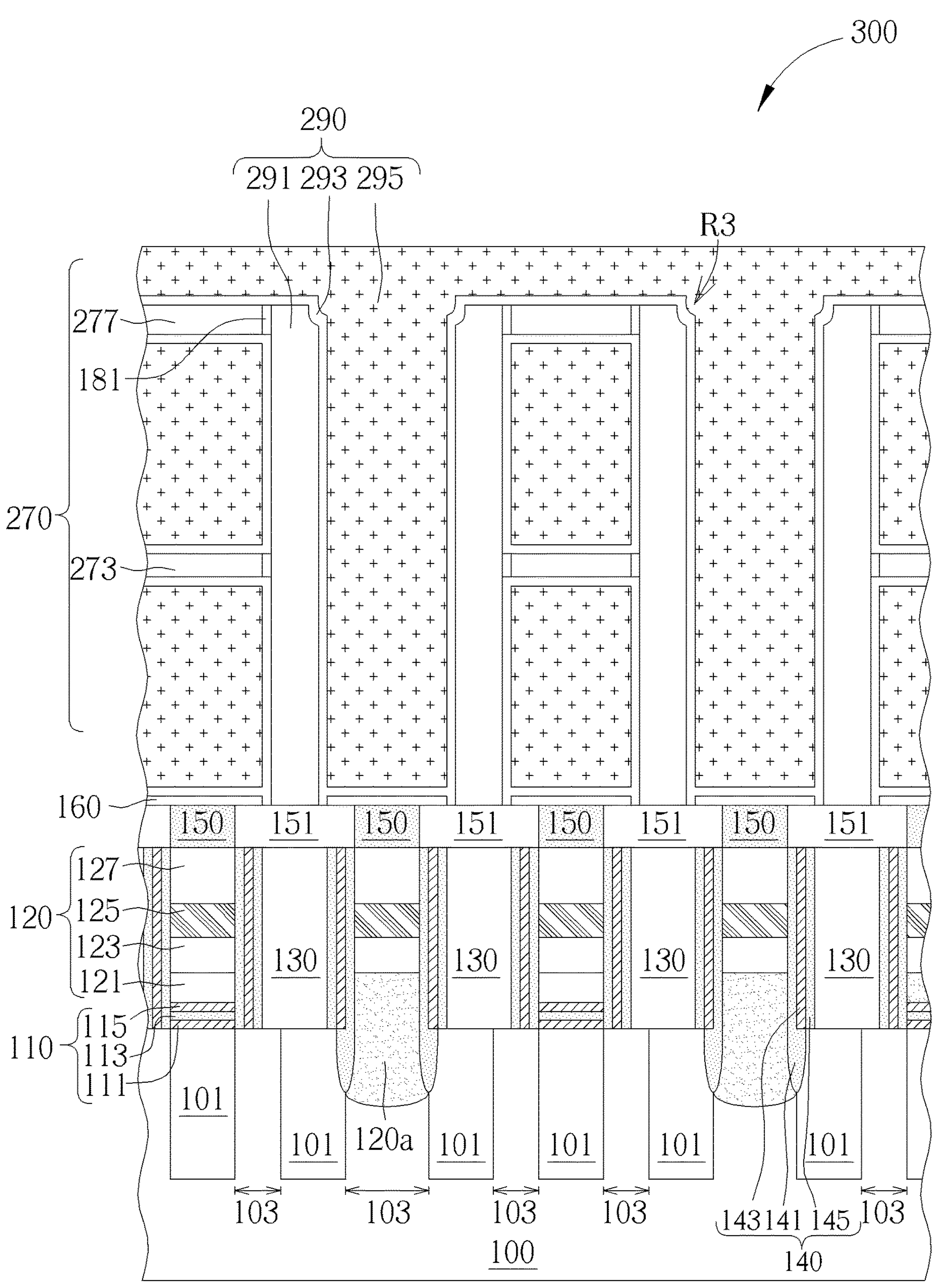

Following these, as shown in FIG. 7, a deposition process is performed on the substrate 100, to sequentially form a capacitor dielectric layer 293 and a top electrode layer 295, and the columnar bottom electrodes 291, the capacitor dielectric layer 293, and the top electrode layer 295 together form a capacitor structure 290. Precisely speaking, the capacitor dielectric layer 293 conformally covers on the exposed surfaces of the columnar bottom electrodes 291, the supporting structure 270, and the insulating layer 160, with the capacitor dielectric layer 293 directly contacting both of the top surfaces and the bottom surfaces of the first supporting layer 273, the second supporting layer 277 and the supplementary layer 181, and with the capacitor dielectric also covering surfaces of the recesses R2 and the gaps G1. Accordingly, a portion of the capacitor dielectric layer 293 forms corresponding recesses R3 on the top of each columnar bottom electrode 291, and another portion of the capacitor dielectric layer 293 filled in the gaps G1 to be sandwiched between the insulating layer 160 and each columnar bottom electrode 291. As following, the top electrode layer 295 is filled in the rest space between the columnar bottom electrodes 291, wherein a portion of the capacitor dielectric layer 293 and a portion of the top electrode layer 295 further fill between the second supporting layer 277 and the first supporting layer 273, and also fill between the first supporting layer 273 and the insulating layer 160. In one embodiment, the capacitor dielectric layer 293 for example includes a high dielectric constant (high-k) dielectric material which is selective from a group consisting of hafnium oxide ($HfO_2$), hafnium silicon oxide ($HfSiO_4$), hafnium silicon oxynitride (HfSiON), titanium oxide ($TiO_2$), zirconium oxide ($ZrO_2$), and zirconia-alumina-zirconia (ZAZ), and preferably includes zirconia-alumina-zirconia. The top electrode layer 295 for example includes a low resistant metal material like aluminum, titanium, copper, or tungsten, and preferably includes titanium, but not limited thereto.

Through these performances, the fabrication of capacitor structure 290 is accomplished thereby. The capacitor structure 290 includes a plurality of vertically extended capacitors, to serve as storage nodes (SNs) of the semiconductor device 300. The storage nodes are allowable to be electrically connected to a transistor (not shown in the drawings) of the semiconductor device 300 through the storage node pads 151 and the storage node contacts (namely the plugs 130), so that, the capacitor structure 290 may therefore gain better contact relationship with the storage node contacts disposed on the substrate 100. In this way, the semiconductor device 300 of the present embodiment may form a DRAM device, which includes at least one transistor (not shown in the drawings) and at least one capacitor, thereto serve as the smallest unit in the DRAM array for accepting signals from the bit lines 120 and the buried word lines during the operation.

According to the fabricating method of the first embodiment of the present disclosure, the sacrificial layers 180 and the bottom electrode layers 191 are firstly formed in the through holes 192, with the sacrificial layers 180 protecting the sidewalls of the bottom electrode layers 191, and the sacrificial layers 180 are partially removed in the subsequent etching process, to form the supplementary layers 181 only between each of the columnar bottom electrodes 291 and the supporting structure 270. In this way, through disposing the supplementary layers 181, the adhesion and the stress buffering between the metal (namely, the columnar bottom electrodes 291) and the dielectric material (namely, the second supporting layer 277 and the first supporting layer 273) are both increased thereby, and the distances between each of the columnar bottom electrodes 291 are further expanded to enlarge the deposition spaces of the capacitor dielectric layer 293 and the top electrode layer 295 formed subsequently. Thus, the deposition of the capacitor dielectric layer 293 and the top electrode layer 295 will be carried out more smoothly in the fabricating method of the present embodiment, to simplify the process flow thereof.

Also, the top of the bottom electrode layers 191 and the sacrificial layers 180 being not covered by the mask patterns 200 may be optionally etched while performing the first etching process, to form the recesses R2 on the top of the columnar bottom electrodes 291, with the recessed opening thereof being away from the supporting structure 270. In this way, two adjacent ones of the columnar bottom electrodes 291 are mirror-symmetric with each other, thereby further enlarging the deposition space for the subsequent forming capacitor dielectric layer 293 and the top electrode layer 295. In other words, based on the fabricating method of the present disclosure, the supplementary layers 181 are formed to enhance the adhesion and the stress buffering between the columnar bottom electrodes 291, the first supporting layer 273 and the second supporting layer 277, with the supplementary layers 181 and the supporting structure 270 together supporting the columnar bottom electrodes 291. Then, the semiconductor device 300 fabricated in the present disclosure will therefore obtain a more reliable and stable structure, to achieve better performances.

People well known in the arts should easily realize the semiconductor device and the fabricating method thereof in the present disclosure is not limited to the aforementioned embodiment, and may further include other examples or variety. For example, in another embodiment, the removal of the sacrificial layers 180 may be optionally integrated into the removing process of a layer with similar materials. For example, when the sacrificial layers 180 include silicon oxide, and a portion of the sacrificial layers 180 may be simultaneously removed while removing the fifth supporting material layer 179 and the third supporting material layer 175 (namely, the second etching process), and further removing another portion of the sacrificial layers 180 while removing the first supporting material layer 171 (namely, the fourth etching process). Then, the fifth etching process may be omitted in the aforementioned another embodiment. The following description will detail the different embodiments of the semiconductor device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
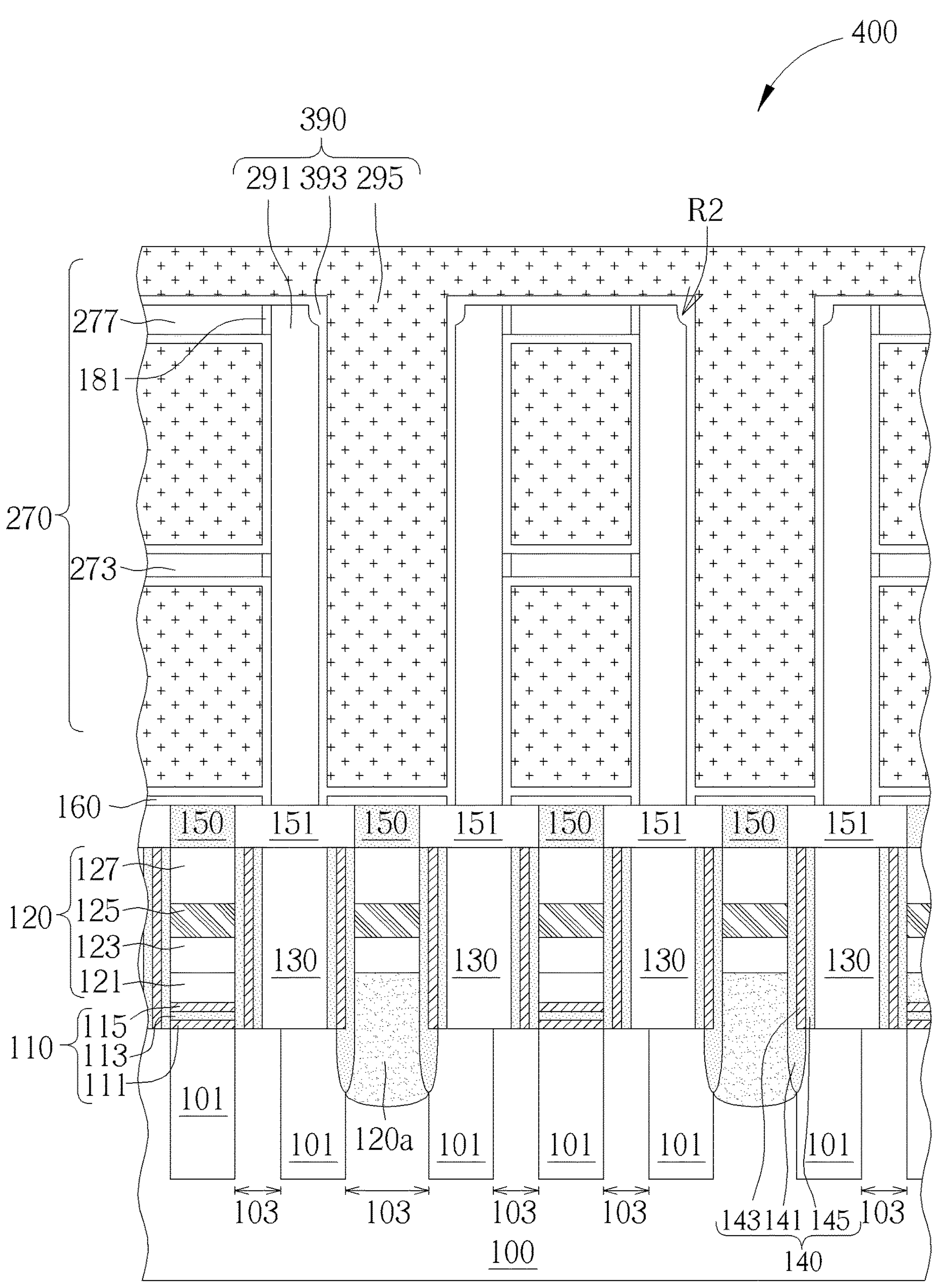
FIG. 8 is a schematic diagram illustrating a fabricating method of a semiconductor device according to a second embodiment in the present disclosure.

Please refer to FIG. 8, illustrating a schematic diagram of a fabricating method of a semiconductor device 400 according to the second embodiment in the present disclosure. The forming processes of the semiconductor device 400 in the present embodiment are substantially the same as those of the semiconductor device 300 in the aforementioned first embodiment, as shown in FIG. 1 to FIG. 6, and all the similarities will not be redundantly described herein after. The difference between the present embodiment and the aforementioned first embodiment is in that in the present embodiment, the capacitor dielectric layer 393 further fills in the recesses R2, and the capacitor dielectric layer 393 will obtain a planar surface thereby.

Precisely speaking, the capacitor dielectric layer 393 also includes a high-k dielectric material which is selective from a group consisting of hafnium oxide, hafnium silicon oxide, hafnium silicon oxynitride, titanium oxide, zirconium oxide, and zirconia-alumina-zirconia, and preferably includes a dielectric material having better filling ability, to fill in the recesses R2 on the top of each columnar bottom electrode 291, as shown in FIG. 8. Then, the columnar bottom electrodes 291, the capacitor dielectric layer 393, and the top electrode layer 295 together form a capacitor structure 390, and the capacity dielectric layer 393 filled in the recesses R2 will be formed on the columnar bottom electrodes 291 in a more stable manner to prevent from pealing thereby.

According to the fabricating method of the second embodiment of the present disclosure, the supplementary layers 181 is also disposed to enhance the adhesion and the stress buffering between the metal (namely, the columnar bottom electrodes 291) and the dielectric material (namely, the supporting structure 270), and to further expand the distances between each of the columnar bottom electrodes 291, thereby enlarging the deposition spaces of the capacitor dielectric layer 393 and the top electrode layer 295 formed subsequently. Thus, the deposition of the capacitor dielectric layer 393 and the top electrode layer 295 are performed more smoothly in the fabricating method of the present embodiment. Meanwhile, since the supplementary layers 181 is allowable to strengthen the adhesion and the stress buffering between the columnar bottom electrodes 291 and the supporting structure 270, the supplementary layers 181 and the supporting structure 270 will together support the columnar bottom electrodes 291, and the semiconductor device 400 may therefore obtain a more reliable and stable structure accordingly, to achieve better functions and performances.

Figure 9:
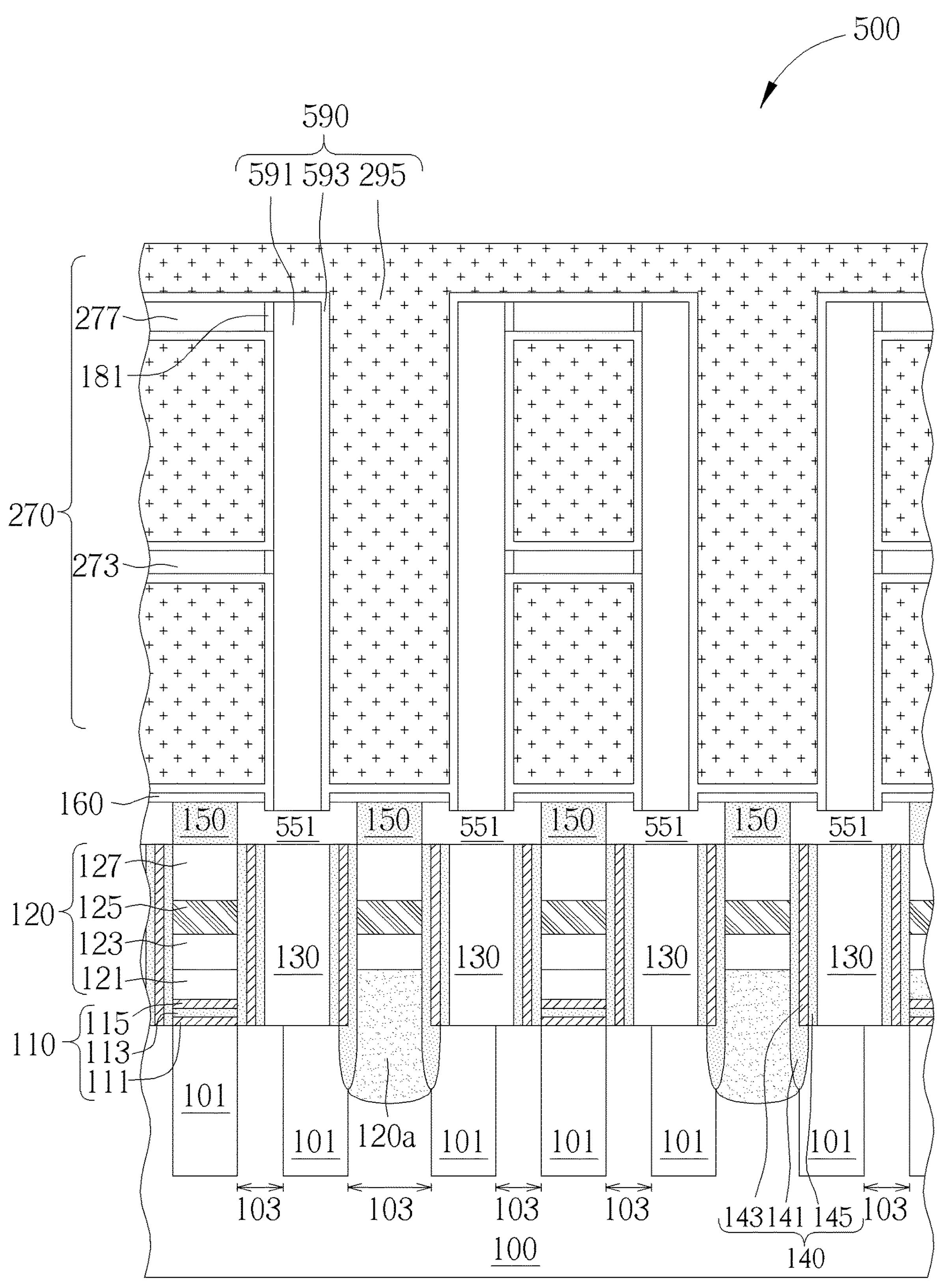
FIG. 9 is a schematic diagram illustrating a fabricating method of a semiconductor device according to a third embodiment in the present disclosure.

Please refer to FIG. 9, illustrating a schematic diagram of a fabricating method of a semiconductor device 500 according to the third embodiment in the present disclosure. The forming processes of the semiconductor device 500 in the present embodiment are substantially the same as those of the semiconductor device 300 in the aforementioned first embodiment, as shown in FIG. 1 to FIG. 6, and all the similarities will not be redundantly described herein after. The difference between the present embodiment and the aforementioned first embodiment is in that, in the present embodiment, each of columnar bottom electrodes 591 does not include any recess on the top, and a bottom of each columnar bottom electrode 591 further extends into each of storage node pads 551.

Precisely speaking, through holes (not shown in the drawings) in the present embodiment sequentially penetrate through the fifth supporting material layer 179, the fourth supporting material layer 177, the third supporting material layer 175, the second supporting material layer 173, the first supporting material layer 171, the insulating layer 160, and a portion of the storage node pads 151 as shown in FIG. 2, thereby forming a recess (not shown in the drawings) on each of the storage node pads 551 being recessed from each through hole. Then, a sacrificial layer (not shown in the drawings) and a bottom electrode layer (not shown in the drawings) formed subsequently are both extended into the recesses on the storage node pads 551 accordingly, to form the columnar bottom electrodes 591.

After that, while performing the first etching process in the present embodiment, the etching selectivity ratio is further adjusted to prevent the exposed portions of the sacrificial layer and the bottom electrode layer related to the mask patterns 200 as shown in FIG. 4 from being etched, without forming any recess on the top of the sacrificial layer and the bottom electrode layer. With these performances, each of the columnar bottom electrodes 591 will have a planar top surface, and a capacitor dielectric layer 593 formed subsequently will also have a planar top surface. Also, each of the columnar bottom electrodes 591 is partially extended into the storage node pads 551 respectively, with a portion of the capacitor dielectric layer 593 also extended into the storage node pads 551, and being sandwiched between each storage node pad 551 and each columnar bottom electrode 591, as shown in FIG. 9. Then, the columnar bottom electrodes 591, the capacitor dielectric layer 593, and the top electrode layer 295 together form a capacitor structure 590 of the present embodiment.

According to the fabricating method of the third embodiment of the present disclosure, the supplementary layers 181 is also disposed to enhance the adhesion and the stress buffering between the metal (namely, the columnar bottom electrodes 591) and the dielectric material (namely, the supporting structure 270), and to further expand the distances between each of the columnar bottom electrodes 591, thereby enlarging the deposition spaces of the capacitor dielectric layer 593 and the top electrode layer 295 formed subsequently. Thus, the deposition of the capacitor dielectric layer 593 and the top electrode layer 295 are performed more smoothly in the fabricating method of the present embodiment. Meanwhile, since the columnar bottom electrodes 591 are further extended into the storage node pads 551 respectively, the contact area between the columnar bottom electrodes 591 and the storage node pads 551 are increased to gain better efficiency. In addition, each of the columnar bottom electrodes 591 are further extended into the storage node pads 551 to further increase the contact area therebetween for gaining better efficiency. Thus, in the semiconductor device 500 of the present embodiment, the supplementary layers 181 disposed therein is also allowable to strengthen the adhesion and the stress buffering between the columnar bottom electrodes 591 and the supporting structure 270, to obtain a more reliable and stable structure, and to achieve better functions and performances accordingly.

Overall speaking, based on the present disclosure, the sacrificial layers are firstly formed on the sidewalls of the through holes before forming the columnar bottom electrodes, with the sacrificial layers protecting the sidewalls of the columnar bottom electrodes, and the sacrificial layers are partially removed in the subsequent etching process, to form the supplementary layers only disposed between the columnar bottom electrodes and the supporting structure. In this way, through disposing the supplementary layers, the adhesion and the stress buffering between the metal (namely, the columnar bottom electrodes) and the dielectric material (namely, the supporting structure) are increased thereby, and the distances between each of the columnar bottom electrodes are further expanded, to enlarge the deposition spaces of the capacitor dielectric layer and the top electrode layer formed subsequently. Thus, the deposition of the capacitor dielectric layer and the top electrode layer are performed more smoothly in the fabricating method of the present disclosure, to simplify the process flow thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate;

a capacitor structure disposed on the substrate, the capacitor structure comprising a plurality of columnar bottom electrodes, a capacitor dielectric layer, and a top electrode layer, wherein each of the columnar bottom electrodes comprises a recess on a top thereof;

a dielectric layer, disposed on the substrate;

a plurality of storage node pads, separately disposed in the dielectric layer and respectively in direct contact with the columnar bottom electrodes;

an insulating layer, disposed on the storage node pads, the insulating layer overlaying and in direct contact with a surface of the dielectric layer and a partial surface of each of the storage node pads, wherein the capacitor dielectric layer is partially sandwiched between the insulating layer and each of the columnar bottom electrodes, and directly contacts a top portion and a sidewall of the insulating layer, and the capacitor dielectric layer direct contacts each of the storage node pads;

a supporting structure, disposed between adjacent ones of the columnar bottom electrodes, the supporting structure comprising a first supporting layer and a second supporting layer stacked from bottom to top; and a supplementary layer, only sandwiched between each of the columnar bottom electrodes and the supporting structure, to directly contact the first supporting layer, the second supporting layer, and sidewalls of the columnar bottom electrodes.

2. The semiconductor device according to claim 1, wherein a portion of each of the columnar bottom electrodes extends into each of the storage node pads.

3. The semiconductor device according to claim 1, wherein a recessed opening of the recess is away from the supporting structure.

4. The semiconductor device according to claim 3, wherein the capacitor dielectric layer covers on the recess.

5. The semiconductor device according to claim 3, wherein the capacitor dielectric layer fills in the recess.

6. The semiconductor device according to claim 3, wherein a bottommost surface of the recess is higher than a bottom surface of the second supporting layer.

7. The semiconductor device according to claim 1, wherein two adjacent ones of the columnar bottom electrodes are mirror-symmetric to each other.

8. A semiconductor device, comprising:

a substrate;

a capacitor structure disposed on the substrate, the capacitor structure comprising a plurality of columnar bottom electrodes, a capacitor dielectric layer, and a top electrode layer;

a dielectric layer, disposed on the substrate;

a plurality of storage node pads, separately disposed in the dielectric layer and respectively in direct contact with the columnar bottom electrodes; and an insulating layer, disposed on the storage node pads, the insulating layer overlaying and in direct contact with a surface of the dielectric layer and a partial surface of each of the storage node pads, wherein the capacitor dielectric layer is partially sandwiched between the insulating layer and each of the columnar bottom electrodes in a direction parallel to the substrate, the capacitor dielectric layer directly contacts a top portion and a sidewall of the insulating layer, and the capacitor dielectric layer direct contacts each of the storage node pads.

9. The semiconductor device according to claim 8, wherein a portion of each of the columnar bottom electrodes extends into each of the storage node pads.

10. The semiconductor device according to claim 8, wherein each of the columnar bottom electrodes comprises a recess on a top thereof, and a recessed opening of the recess is away from the supporting structure.

11. The semiconductor device according to claim 8, wherein the capacitor dielectric layer covers on the recess.

12. The semiconductor device according to claim 8, wherein the capacitor dielectric layer fills in the recess.

13. The semiconductor device according to claim 8, wherein a bottommost surface of the recess is higher than a bottom surface of the second supporting layer.

14. The semiconductor device according to claim 8, wherein two adjacent ones of the columnar bottom electrodes are mirror-symmetric to each other.

15. A semiconductor device, comprising:

a substrate, comprising an active area;

a bit line, disposed on the substrate;

a bit line contact disposed below the bit line and extending into the active area;

a dielectric layer, disposed on the bit line;

a plurality of storage node pads, separately disposed in the dielectric layer and in direct contact with a plurality of storage node contacts respectively;

a capacitor structure disposed on the storage node pads, the capacitor structure comprising a plurality of columnar bottom electrodes, a capacitor dielectric layer, and a top electrode layer disposed in sequence; and an insulating layer, disposed on the storage node pads, the insulating layer overlaying and in direct contact with a surface of the dielectric layer and a partial surface of each of the storage node pads, wherein the capacitor dielectric layer directly contacts a top portion and a sidewall of the insulating layer.

16. The semiconductor device according to claim 15, wherein a portion of each of the columnar bottom electrodes extends into each of the storage node pads.

17. The semiconductor device according to claim 15, wherein a portion of the capacitor dielectric layer is sandwiched between the insulating layer and each of the columnar bottom electrodes.

18. The semiconductor device according to claim 15, wherein each of the columnar bottom electrodes comprises a recess on a top thereof, and a recessed opening of the recess is away from the supporting structure.

19. The semiconductor device according to claim 18, wherein the capacitor dielectric layer covers on the recess.

20. The semiconductor device according to claim 18, wherein the capacitor dielectric layer fills in the recess.

* * * * *